US012684991B2

(12) United States Patent  (10) Patent No.: US 12,684,991 B2
Hu  (45) Date of Patent: Jul. 14, 2026

(54) DISPLAY PANEL AND METHOD OF MANUFACTURING SAME, AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Xiaojing Hu, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 733 days.

(21) Appl. No.: 17/758,974

(22) PCT Filed: Jun. 30, 2022

(86) PCT No.: PCT/CN2022/103003
§ 371 (c)(1),
(2) Date: Jul. 17, 2022

(87) PCT Pub. No.: WO2023/236291
PCT Pub. Date: Dec. 14, 2023

(65) Prior Publication Data
US 2024/0179995 A1 May 30, 2024

(30) Foreign Application Priority Data
Jun. 10, 2022 (CN) .......................... 202210658162.9

(51) Int. Cl.
*H10K 59/80* (2023.01)
*H10K 59/12* (2023.01)
*H10K 102/00* (2023.01)

(52) U.S. Cl.
CPC ......... *H10K 59/80* (2023.02); *H10K 59/1201* (2023.02); *H10K 2102/311* (2023.02)

(58) Field of Classification Search
CPC ............... H10K 59/80; H10K 59/1201; H10K 2102/311
See application file for complete search history.

(56) References Cited

U.S. PATENT DOCUMENTS

2003/0071579 A1   4/2003   Ryu
2010/0039603 A1   2/2010   Chen
(Continued)

FOREIGN PATENT DOCUMENTS

CN        103930502 A       7/2014
CN        108777112 A       11/2018
(Continued)

OTHER PUBLICATIONS (Frankland, "Understanding the Effect of Polymer Viscosity on Melt Temperature", https://www.ptonline.com/blog/post/understanding-the-effect-of-polymer-viscosity-on-melt-temperature, Sep. 10, 2020) (Year: 2020).*

(Continued)

*Primary Examiner* — Joshua Benitez Rosario
*Assistant Examiner* — Christopher A Culbert
(74) *Attorney, Agent, or Firm* — PV IP PC; Peter Stecher; Wei Te Chung

(57) ABSTRACT

A display panel and a method of manufacturing the same, and a display device are provided. The display panel includes a display panel body and a backplane arranged on a backlight side of the display panel body. The display panel body includes a display area, a bending area, and a bonding area. The bending area is located between the display area (Continued)

and the bonding area. The display panel includes a heat-sensitive adhesive layer disposed between the backplane and the display panel body.

13 Claims, 3 Drawing Sheets

(56)                    References Cited

U.S. PATENT DOCUMENTS

| | | | |
|---|---|---|---|
| 2015/0062467 A1* | 3/2015 | Kang | G06F 3/0446 |
| | | | 349/12 |
| 2015/0129122 A1* | 5/2015 | Kim | H10K 71/80 |
| | | | 156/247 |
| 2015/0200375 A1* | 7/2015 | Kim | H10K 77/111 |
| | | | 257/40 |
| 2017/0313900 A1* | 11/2017 | Lee | C09D 4/00 |

FOREIGN PATENT DOCUMENTS

| | | | |
|---|---|---|---|
| CN | 111605282 A | 9/2020 |
| CN | 112365805 A | 2/2021 |
| CN | 112634755 A | 4/2021 |
| CN | 112786809 A | 5/2021 |
| CN | 113380852 A | 9/2021 |
| CN | 114300638 A | 4/2022 |
| JP | 2003108038 A | 4/2003 |

OTHER PUBLICATIONS

Chinese Office Action issued in corresponding Chinese Patent Application No. 202210658162.9 dated May 30, 2025, pp. 1-8.
International Search Report in International application No. PCT/CN2022/103003, mailed on Dec. 16, 2022.
Written Opinion of the International Search Authority in International application No. PCT/CN2022/103003,mailed on Dec. 16, 2022.

* cited by examiner

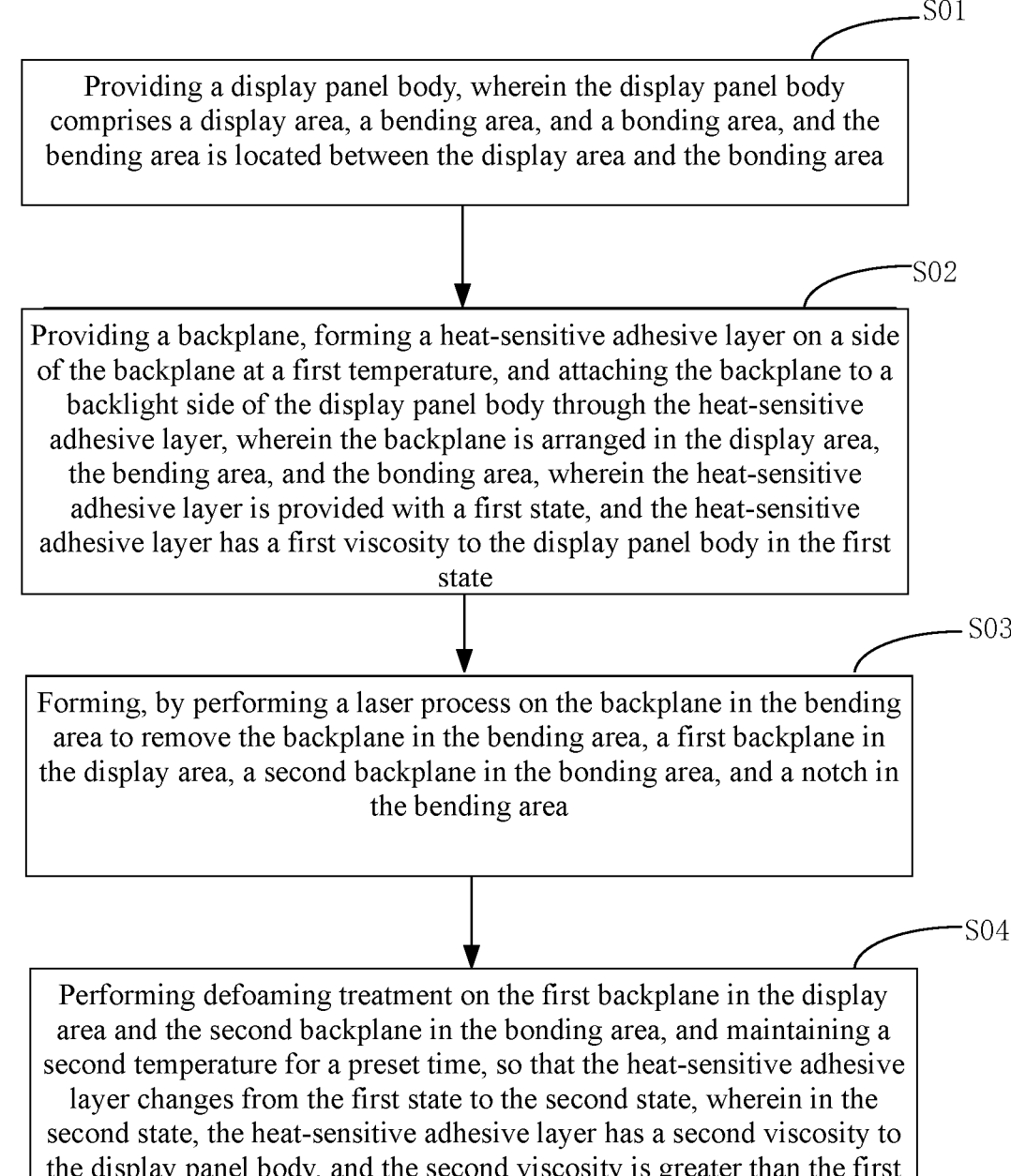

S01

Providing a display panel body, wherein the display panel body comprises a display area, a bending area, and a bonding area, and the bending area is located between the display area and the bonding area

S02

Providing a backplane, forming a heat-sensitive adhesive layer on a side of the backplane at a first temperature, and attaching the backplane to a backlight side of the display panel body through the heat-sensitive adhesive layer, wherein the backplane is arranged in the display area, the bending area, and the bonding area, wherein the heat-sensitive adhesive layer is provided with a first state, and the heat-sensitive adhesive layer has a first viscosity to the display panel body in the first state

S03

Forming, by performing a laser process on the backplane in the bending area to remove the backplane in the bending area, a first backplane in the display area, a second backplane in the bonding area, and a notch in the bending area

S04

Performing defoaming treatment on the first backplane in the display area and the second backplane in the bonding area, and maintaining a second temperature for a preset time, so that the heat-sensitive adhesive layer changes from the first state to the second state, wherein in the second state, the heat-sensitive adhesive layer has a second viscosity to the display panel body, and the second viscosity is greater than the first viscosity

FIG. 2

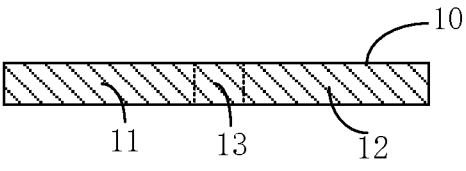
FIG. 3
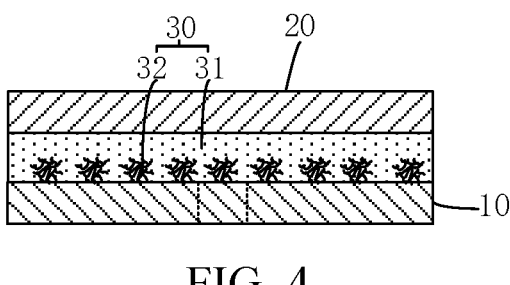
FIG. 4
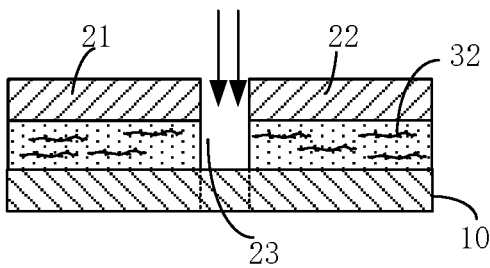
FIG. 5
FIG. 6

DISPLAY PANEL AND METHOD OF MANUFACTURING SAME, AND DISPLAY DEVICE

BACKGROUND OF INVENTION

1. Field of Invention

The present application relates to a technical field of displays, and particularly to a display panel and a method of manufacturing the same, and a display device.

2. Related Art

Organic light-emitting diode (OLED) display panels, compared with liquid crystal displays, have advantages of being lighter and thinner, better display performance, higher resolution, wider color gamut, lower power consumption, etc., and can achieve flexible display. For this reason, OLED display panels have developed rapidly in recent years and become the preferred display panel type for mobile terminals.

Since OLED display panels are flexible and bendable, bonding areas (or terminal areas) at bottom of the OLED display panels can be bent to the back of the OLED display panels, so that width of lower borders are narrowed to realize narrow bezel design. In order to facilitate bending, it is necessary to groove areas corresponding to bending areas of backplanes of display panels. Generally, the backplanes are grooved by means of die cutters, and then the backplanes being cut are attached to display panel bodies through pressure-sensitive adhesive. However, the die cutters have a certain precision error, and there is also a certain fitting tolerance during fitting processes that give rise to relatively wide widths of grooves of the backplanes finally attached to the display panel bodies, relatively great lengths of the bending areas, relatively large bending radiuses, and bezel widths failing to meet design requirements, which is not conducive to the design of ultra-narrow bezels, and this problem needs to be solved urgently.

SUMMARY OF INVENTION

An object of the present application is to provide a display panel, a method of manufacturing the same, and a display device that can solve a problem of relatively wide widths of grooves of backplanes, relatively large bending radiuses, and bezel width failing to meet design requirements in conventional organic light-emitting diode (OLED) display panels.

In one aspect, the present application provides a display panel including a display panel body and a backplane arranged on a backlight side of the display panel body. The display panel body includes a display area, a bending area, and a bonding area, and the bending area is located between the display area and the bonding area, and a heat-sensitive adhesive layer is disposed between the backplane and the display panel body.

Optionally, the heat-sensitive adhesive layer is provided with a first state and a second state, wherein the heat-sensitive adhesive layer has a first viscosity to the display panel body in the first state, a second viscosity to the display panel body in the second state, and the second viscosity is greater than the first viscosity.

Optionally, the heat-sensitive adhesive layer includes an adhesive layer and temperature-responsive polymers. Specifically, in the first state, the temperature-responsive polymers are aggregated on a surface of the adhesive layer close to the display panel body, and in the second state, the temperature-responsive polymers are dispersed in the adhesive layer.

Optionally, the display panel body includes a base substrate, and the backplane is attached to the base substrate through the heat-sensitive adhesive layer. Each of the temperature-responsive polymers and the base substrate is hydrophilic.

Optionally, a material of the temperature-responsive polymers is (PEO-b-PNIPAM)-g-PBAMO, and the base substrate is made of polyimide.

Optionally, a length of the bending area is less than or equal to 0.7 millimeters (mm).

Optionally, the backplane comprises a notch located in the bending area, and the notch is formed by a laser process.

Optionally, the laser process is a femtosecond laser process.

In another aspect, the present application provides a method of manufacturing a display panel, and the method includes:

providing a display panel body, wherein the display panel body comprises a display area, a bending area, and a bonding area, and the bending area is located between the display area and the bonding area;

providing a backplane, forming a heat-sensitive adhesive layer on a side of the backplane at a first temperature, and attaching the backplane to a backlight side of the display panel body through the heat-sensitive adhesive layer, wherein the backplane is arranged in the display area, the bending area, and the bonding area, wherein the heat-sensitive adhesive layer is provided with a first state, and the heat-sensitive adhesive layer has a first viscosity to the display panel body in the first state;

forming, by performing a laser process on the backplane in the bending area to remove the backplane in the bending area, a first backplane in the display area, a second backplane in the bonding area, and a notch in the bending area; and performing defoaming treatment on the first backplane in the display area and the second backplane in the bonding area, and maintaining a second temperature for a preset time, so that the heat-sensitive adhesive layer changes from the first state to the second state, wherein in the second state, the heat-sensitive adhesive layer has a second viscosity to the display panel body, and the second viscosity is greater than the first viscosity.

Optionally, the heat-sensitive adhesive layer includes an adhesive layer and temperature-responsive polymers. Specifically, in the first state, the temperature-responsive polymers are aggregated on a surface of the adhesive layer close to the display panel body, and in the second state, the temperature-responsive polymers are dispersed in the adhesive layer.

Optionally, the display panel body includes a base substrate, and the backplane is attached to the base substrate through the heat-sensitive adhesive layer. Each of the temperature-responsive polymers and the base substrate is hydrophilic.

Optionally, the first temperature ranges from 20° C. to 30° C., the first viscosity is 50-100 gram-force/inch (gf/inch), and the laser process is a femtosecond laser process. The second temperature is greater than or equal to 50° C., the second viscosity is greater than or equal to 500 gf/inch, and the preset time is greater than or equal to 15 minutes.

In another aspect, the present application further provides a display device, including a casing and the display panel as mentioned above. The casing forms an accommodating space, and the display panel is arranged in the accommodating space.

The present application has advantageous effects as follows: the present application provides the display panel, the method of manufacturing the same, and the display device. The display panel includes the backplane, the display panel body, and the heat-sensitive adhesive layer. The heat-sensitive adhesive layer is located between the backplane and the display panel body and is provided with two states with different viscosities. A viscosity is relatively low in one state, so that it facilitates laser grooving on the backplane attached to the display panel body, eliminates fitting tolerance, and improves grooving accuracy, thus greatly reducing the width of the bending area. In another state, the viscosity is higher, so that the bonding quality of the backplane and the display panel body can be ensured.

BRIEF DESCRIPTION OF DRAWINGS

In order to better illustrate the technical solutions in the embodiments of the present application, the following will briefly introduce the accompanying drawings that need to be used in the description of the embodiments. Apparently, the accompanying drawings in the following description show merely some embodiments of the present invention, and a person skilled in the art may still derive other drawings from these accompanying drawings without creative efforts.

FIG. 2 is a flowchart of a method of manufacturing a display panel provided in an embodiment of the present application.

FIG. 3 is a schematic structural view of a display panel body corresponding to step S01.

FIG. 4 is a schematic structural view of the display panel body, a backplane, and a heat-sensitive adhesive layer corresponding to step S02.

FIG. 5 is a schematic structural view of the display panel body, the backplane, and the heat-sensitive adhesive layer corresponding to step S03.

FIG. 6 is a schematic structural view of the display panel body, the backplane, and the heat-sensitive adhesive layer corresponding to step S04.

DESCRIPTION OF PREFERRED EMBODIMENTS

Figure 1:
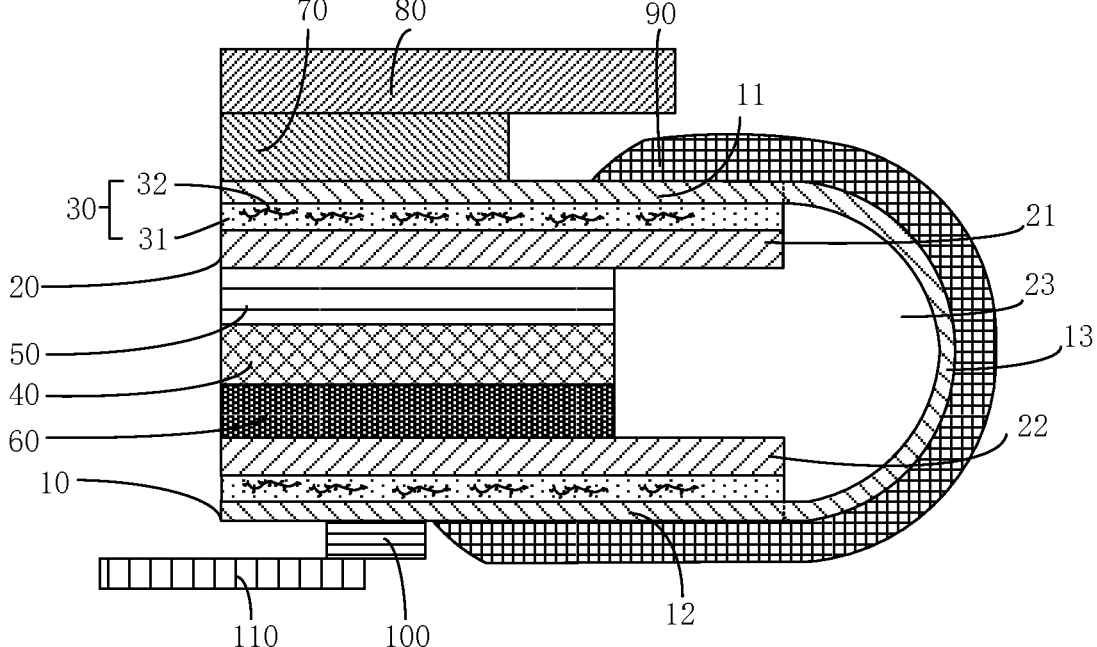
FIG. 1 is a schematic structural view of a display panel provided in an embodiment of the present application.

The technical solutions in the embodiments of the present application will be clearly and completely described below in conjunction with the drawings in the embodiments of the present application. Apparently, the described embodiments are only a part of the embodiments of the present application, but not all of the embodiments. Based on the embodiments in this application, all other embodiments obtained by those skilled in the art without creative work shall fall within the protection scope of this application. It should be understood that the specific embodiments described here are only used to illustrate the present application, and are not used to limit the present application. In this application, if no explanation is made to the contrary, the orientation words used, such as "upper" and "lower" usually refer to the upper and lower positions of the device in actual use or working state. Specifically, they refer to the direction of the drawings, and "inner" and "outer" refer to the outline of the device.

The following disclosure provides many different embodiments or examples for implementing different structures of the present application. To simplify the disclosure of the present application, the components and arrangements of specific examples are described below. Of course, they are only examples and are not intended to limit the application. Furthermore, this application may repeat reference numerals and/or reference letters in different instances for the purpose of simplicity and clarity, and does not in itself indicate the relationship between the various embodiments—and/or arrangements discussed. Moreover, this application provides examples of various specific processes and materials, but one of ordinary skill in the art will recognize the application of other processes and/or the use of other materials. The following is a detailed description of the embodiments of the present application. It should be noted that the description order of the following embodiments is not intended to limit the preferred order of the embodiments.

The inventor of the present application has found after research that in a manufacturing process of a flexible display panel, in order to facilitate bending of a bending area, a grooving design is performed in an area of a backplane corresponding to the bending area. However, current backplane fabrication processes are to first use a die cutter to cut and groove a full-face backplane, and then attach the cut backplane to a display panel body through pressure-sensitive adhesive. Unfortunately, a precision limit of the die cutter is relatively large, generally ±50 microns (μm). In addition, there will be a certain tolerance of the backplane during a lamination process, generally ±100 μm. The above-mentioned two precision tolerances added together gives rise to a relative wide width of a groove of the backplane that is finally attached to the display panel body and a relatively great length of the bending area. After being finally bent by a pad bending process, a bending radius of the display panel is relatively large and a bezel is relatively wide, making it difficult to meet frame design requirements.

The inventor of the present application has found after further research that by first bonding the backplane to the display panel body, and then grooving the backplane attached to the display panel body, bonding tolerance can be effectively eliminated. In addition, compared with traditional die cutting processes, laser grooving has higher grooving accuracy, which can effectively reduce width of the groove. But the problem is that the backplane attached to the display panel body is fixed by pressure-sensitive adhesive, which has high viscosity, whereas laser is known for high energy. If laser grooving is performed directly on the backplane attached to the display panel body, an adhesion phenomenon between the backplane and the pressure-sensitive adhesive will occur, which significantly reduces the grooving precision and the grooving quality, thus still making it difficult to shorten length of the bending area, and borders are still wider.

A display panel, a method of manufacturing the same, and a display device provided in the present application aim to solve the above technical problems in prior art.

The technical solutions of the present application and how the technical solutions of the present application solve the above-mentioned technical problems will be described in detail below with specific examples.

FIG. 1 is a schematic structural view of a display panel provided in an embodiment of the present application. As shown in FIG. 1, the display panel includes a display panel body 10 and a backplane 20 arranged on a backlight side of the display panel body 10. The display panel body 10 includes a display area 11, a bending area 13, and a bonding area 12. The bending area 13 is located between the display area 11 and the bonding area 12. The backplane 20 includes a first backplane 21 disposed in the display area 11, a second backplane 22 disposed in the binding area 12, and a notch 23 formed in the bending area 13. The display panel further includes a heat-sensitive adhesive layer 30 disposed between the backplane 20 and the display panel body 10.

In the display panel provided in the present application, the heat-sensitive adhesive layer 30 is provided with two states with different viscosities. A viscosity is relatively low in one state, so that it facilitates laser grooving on the backplane 20 attached to the display panel body 10, ensures quality of the laser grooving, and eliminates the adhesion phenomenon between the backplane 20 and the display panel body 10 during a laser grooving process due to strong adhesive force of colloids. In addition, by means of processes that the back plate 20 and the display panel body 10 are bonded first and the laser grooving is performed subsequently to fabricate the display panel, the bonding tolerance is eliminated, the grooving precision is improved, the length of the bending area 13 is greatly reduced, and the border of the display panel is narrowed. In another state, the viscosity is higher, so that the bonding quality of the backplane 20 and the display panel body 10 can be ensured.

Specifically, in the present application, the backplane 20 is firstly attached to the display panel body 10 and then the grooving process is performed. Compared with the backplane in the prior art, which is grooved first and then bonded, the bonding tolerance in the present application can be effectively eliminated. In addition, during a laser grooving process, the viscosity of the heat-sensitive adhesive layer 30 in an initial state is relatively low, so that a problem of adhesion between the backplane 20 and the display panel body 10 caused by the laser process grooving can be prevented, the backplane 20 attached to the display panel body 10 can be normally grooved by a laser grooving process with higher precision, thereby greatly reducing width of the bending area 13 and achieving an ultra-narrow bezel. Furthermore, after the backplane 20 attached to the display panel body 10 forms a narrower width of the notch 23, another temperature treatment is performed on the heat-sensitive adhesive layer 30, so that the heat-sensitive adhesive layer 30 can be changed from the initial state to another state with enhanced viscosity and stability, thereby ensuring the bonding quality of the backplane 20 and the display panel body 10, as well as support of the backplane 20 to the display panel body 10.

In some embodiments of the present application, the display panel is a flexible display panel, specifically, a flexible organic light-emitting diode (OLED) display panel.

In some embodiments of the present application, the display panel body 10 includes a base substrate, a driving circuit layer disposed on the base substrate, a light-emitting functional layer disposed on the driving circuit layer, and an encapsulation layer disposed on the light-emitting functional layer. The display panel body 10 is configured to perform a display function and includes a display side and a backlight side.

In some embodiments of the present application, the backplane 20 is disposed on the backlight side of the display panel body 10, and the backplane 20 is configured to support the display panel body 10. Specifically, the backplane 20 is disposed on a side of the base substrate away from the driving circuit layer.

In some embodiments of the present application, the heat-sensitive adhesive layer 30 is provided with a first state and a second state. In the first state, the heat-sensitive adhesive layer 30 has a first viscosity to the display panel body 10; in the second state, the heat-sensitive adhesive layer 30 has a second viscosity to the display panel body 10, and the second viscosity is greater than the first viscosity.

Specifically, the heat-sensitive adhesive layer 30 is provided with the first viscosity before high temperature treatment, and is provided with the second viscosity after high temperature treatment. That is, the heat-sensitive adhesive layer 30 maintains a relatively low viscosity to the display panel body 10 before the high temperature treatment, so as to ensure that the backplane 20 attached to the display panel body 10 can normally grooved by a laser process with higher precision. The notch 23 having a narrower groove width is formed in the bending area 13 of the display panel body 10. After the heat-sensitive adhesive layer 30 is treated at a high temperature, the viscosity to the display panel body 10 can be enhanced, so that the backplane 20 can be well attached to the display area 11 and the bonding area 12 on the display panel body 10 through the heat-sensitive adhesive layer 30 to form the first backplane 21 and the second backplane 22. Specifically, the heat-sensitive adhesive layer 30 is always in a first temperature environment before high temperature treatment, and the first temperature is room temperature, such as 20° C.-30° C. The first viscosity is 50-100 gram-force/inch (gf/inch). The high temperature treatment process is performed at a temperature defined as a second temperature. The second temperature is greater than or equal to 50° C., a treatment time of the high temperature treatment process is more than 15 minutes, and the second viscosity is 500 gf/inch.

In some embodiments of the present application, the heat-sensitive adhesive layer 30 includes an adhesive layer 31 and temperature-responsive polymers 32. Specifically, in the first state, the temperature-responsive polymers 32 are aggregated on a surface of the adhesive layer 31 close to the display panel body 10, and in the second state, the temperature-responsive polymers 32 are dispersed in the adhesive layer 31. Specifically, In the first state, since the temperature-responsive polymers 32 are aggregated on the surface of the adhesive layer 31 close to the display panel body 10, a certain hindering effect can be produced against a direct contact between the adhesive layer 31 and the display panel body 10, so that a contact area between the adhesive layer 31 and the display panel body 10 can be kept in a relatively low range, thereby reducing the viscosity of the heat-sensitive adhesive layer 30 to the display panel body 10. In the second state, the temperature-responsive polymers 32 are dispersed in the adhesive layer 31, so that the contact area between the adhesive layer 31 and the display panel body 10 can be enlarged, thereby increasing the viscosity of the heat-sensitive adhesive layer 30 to the display panel body 10.

In some embodiments of the present application, a material of the adhesive layer 31 is colloid, such as pressure-sensitive adhesive, or other adhesive colloid.

In some embodiments of the present application, the backplane 20 is attached to the base substrate through the heat-sensitive adhesive layer 30. Specifically, the base substrate may be made of at least one of polyimide (PI for short) or polyethylene terephthalate (PET for short). Preferably, the base substrate is hydrophilic, such as hydrophilic PI.

In some embodiments of the present application, the temperature-responsive polymers 32 are also hydrophilicity, such as a polymer brush with hydrophilicity and temperature response, such as (PEO-b-PNIPAM)-g-PBAMO. Specifically, PEO-b-PNIPAM is a block copolymer of polyethylene glycol and poly-N-isopropylacrylamide, and PBAMO is poly-3,3-diazidomethyl butylene oxide.

In some embodiments of the present application, both the temperature-responsive polymers 32 and the base substrate are hydrophilic. Specifically, since both the temperature-responsive polymers 32 and the base substrate are hydrophilic, in the first state at room temperature, the temperature-responsive polymers 32 in the heat-sensitive adhesive layer 30 can be aggregated on a side close to the base substrate, so that the temperature-responsive polymers 32 are gathered on the surface of the adhesive layer 31 close to the display panel body 10, thereby producing a certain insulating effect on the bonding between the adhesive layer 31 and the base substrate, so that the adhesion of the heat-sensitive adhesive layer 30 to the display panel body 10 is significantly reduced, and the precision of the laser grooving process is further improved. The high temperature treatment can disperse the temperature-responsive polymers 32 originally gathered on the surface of the adhesive layer 31 close to the base substrate, so that an adhesion effect of the adhesive layer 31 to the backplane 20 is greatly enhanced, enabling the heat-sensitive adhesive layer 30 to change from the first state to the second state, and ensuring the bonding quality of the display panel body 10 and the backplane 20. It should be noted that the heat-sensitive adhesive layer 30 in the display panel in the finished state is a heat-sensitive adhesive with a stable second state after the high temperature treatment, and the temperature-responsive polymers 32 in the heat-sensitive adhesive layer 30 are dispersed in the adhesive layer 31.

In some embodiments of the present application, a length of the bending area 13 is less than or equal to 0.7 millimeters (mm). Here, the length of the bending area 13 is a spacing between the display area 11 and the bonding area 12 when the display panel is unfolded. Since the bending area 13 of a finished display panel is generally a semicircular arc with a fixed bending radius R, when the bending area 13 is a semicircular arc with the fixed bending radius R, a length of the bending area 13 is equal to π R, and π R is less than or equal to 0.7 mm.

In some embodiments of the present application, after the display panel body 10 is bent, the second backplane 22 is bent to a side where the first backplane 21 faces away from the display area 11 of the display panel body 10, so that the first backplane 21 and the second backplane 22 are disposed opposite to each other.

In some embodiments of the present application, the display panel further includes a buffer layer 50 disposed between the first backplane 21 and the second backplane 22, a support sheet 40, and a double-sided tape 60. Specifically, the support sheet 40 is arranged between the buffer layer 50 and the double-sided adhesive tape 60 and can be made of a steel sheet. The buffer layer 50 is arranged between the support sheet 40 and the first backplane 21 and can be made of foam. The double-sided tape 60 is arranged between the support sheet 40 and the second backplane 22, and the double-sided tape 60 attaches the support sheet 40 to the second backplane 22 to create a fixed connection.

In some embodiments of the present application, the display panel further includes an anti-reflection layer 70 disposed on a side of the display panel body 10 in the display area 11 away from the first backplane 21. The anti-reflection layer 70 is configured to reduce reflected light generated by reflection of external ambient light on the display panel, thereby improving a display effect of the display panel. The anti-reflection layer 70 may be one of a polarizer or a color filter.

In some embodiments of the present application, the display panel further includes a flexible cover plate 80 disposed on the anti-reflection layer 70 away from the display area 11. The flexible cover plate 80 may be a curved cover plate or a flat cover plate.

In some embodiments of the present application, the display panel further includes a protection adhesive 90 located on a side of the display panel body 10 away from the backplane 20 and is disposed at least in the bending area 13 to protect the display panel body 10 in the bending area 13.

In some embodiments of the present application, the display panel further includes an integrated circuit (IC) 100 and a flexible circuit board 110. The integrated circuit 100 and the flexible circuit board 110 are located on the side of the display panel body 10 away from the backplane 20 and disposed in the bonding area 12 of the display panel body 10.

In addition, the present application further provides a method of manufacturing a display panel. FIG. 2 is a flowchart of the method of manufacturing the display panel provided in an embodiment of the present application. FIG. 3 is a schematic structural view of the display panel body corresponding to step S01. FIG. 4 is a schematic structural view of the display panel body, a backplane, and a heat-sensitive adhesive layer corresponding to step S02. FIG. 5 is a schematic structural view of the display panel body, the backplane, and the heat-sensitive adhesive layer corresponding to step S03. FIG. 6 is a schematic structural view of the display panel body, the backplane, and the heat-sensitive adhesive layer corresponding to step S04. Referring to FIGS. 2 to 6, the method of manufacturing the display panel includes steps as follows:

Step S01: providing a display panel body 10. The display panel body 10 includes a display area 11, a bending area 12, and a bonding area 12, and the bending area 13 is located between the display area 11 and the bonding area 12.

Step S02: providing a backplane 20, forming a heat-sensitive adhesive layer 30 on a side of the backplane 20 at a first temperature, and attaching the backplane 20 to a backlight side of the display panel body 10 through the heat-sensitive adhesive layer 30. Specifically, the backplane 20 is arranged in the display area 11, the bending area 13, and the bonding area 12. The heat-sensitive adhesive layer 30 is provided with a first state, and the heat-sensitive adhesive layer 30 has a first viscosity to the display panel body 10 in the first state.

Step S03: forming, by performing a laser process on the backplane 20 in the bending area 13 to remove the backplane 20 in the bending area 13, a first backplane 21 in the display area, a second backplane 22 in the bonding area 12, and a notch 23 in the bending area 13.

Step S04: performing defoaming treatment on the first backplane 21 in the display area 11 and the second backplane 22 in the bonding area 12, and maintaining a second temperature for a preset time, so that the heat-sensitive adhesive layer 30 changes from the first state to the second state. In the second state, the heat-sensitive adhesive layer 30 has a second viscosity to the display panel body 10, and the second viscosity is greater than the first viscosity.

In some embodiments of the present application, the heat-sensitive adhesive layer 30 is always in the environment of the first temperature before being treated at the second temperature, and has the first viscosity. In addition, the heat-sensitive adhesive layer 30 has the second viscosity after a second temperature treatment. Specifically, the second temperature is greater than the first temperature and the second viscosity is greater than the first viscosity.

In some embodiments of the present application, the heat-sensitive adhesive layer 30 includes an adhesive layer 31 and temperature-responsive polymers 32. Specifically, in the first state, the temperature-responsive polymers 32 are aggregated on a surface of the adhesive layer 31 close to the display panel body 10, and in the second state, the temperature-responsive polymers 32 are dispersed in the adhesive layer 31.

In some embodiments of the present application, the display panel body includes a base substrate, and the backplane 20 is attached to the base substrate through the heat-sensitive adhesive layer, wherein each of the temperature-responsive polymers and the base substrate is hydrophilic. Specifically, in Step S03, since both the temperature-responsive polymers 32 and the base substrate is hydrophilic, in the first state at room temperature, the temperature-responsive polymers 32 in the heat-sensitive adhesive layer 30 can be aggregated on a side close to the base substrate, so that the temperature-responsive polymers 32 are gathered on the surface of the adhesive layer 31 close to the display panel body 10, thereby producing a certain insulating effect on the bonding between the adhesive layer 31 and the base substrate, so that the adhesion of the heat-sensitive adhesive layer 30 to the display panel body 10 is significantly reduced, thus providing conditions for the application of the laser process. In Step S04, after the heat-sensitive adhesive layer 30 is kept at the second temperature for the present time, the heat-sensitive adhesive layer 30 is switched from the first state to the second state, and the temperature-responsive polymers 32 in the heat-sensitive adhesive layer 30 are dispersed in the adhesive layer 31, thereby greatly enhancing an adhesion effect of the adhesive layer 31 to the display panel body 10, and ensuring the bonding quality of the backplane 20 and the display panel body 10.

In some embodiments of the present application, the first temperature is room temperature, ranging from 20° C. to 30° C. The first viscosity is 50-100 gf/inch, and the laser process is a femtosecond laser process. By using the femtosecond laser process, a processing time of the laser process can be further shortened, a thermal effect of the laser on the heat-sensitive adhesive layer 30 can be reduced, and a risk of the heat-sensitive adhesive layer 30 being viscous or overflowing can be reduced. The second temperature is greater than or equal to 50° C., the second viscosity is greater than or equal to 500 gf/inch, and the preset time is greater than or equal to 15 minutes.

In some embodiments of the present application, the method of manufacturing the display panel further includes step S05: bending the display panel to enable the second backplane 22 to be bent to a side of the first backplane 21 away from the display panel body 10 in the display area 11.

Still further, the present application further provides a display device, including a casing and the display panel described in any one of the above-mentioned embodiments. The casing forms an accommodating space, and the display panel is arranged in the accommodating space.

Accordingly, the present application provides a display panel and a method of manufacturing the same, and a display device. The display panel includes a display panel body and a backplane arranged on a backlight side of the display panel body. The display panel body includes a display area, a bending area, and a bonding area. The bending area is located between the display area and the bonding area. The display panel further includes a heat-sensitive adhesive layer disposed between the backplane and the display panel body. In the display panel provided in the present application, the heat-sensitive adhesive layer is provided with two states with different viscosities. A viscosity is relatively low in one state, so that it facilitates laser grooving on the backplane attached to the display panel body, eliminates fitting tolerance, improves grooving accuracy, and greatly reduces the width of the bending area. In another state, the viscosity is higher, so that the bonding quality of the backplane and the display panel body can be ensured.

The above describes in detail the display panel and the method of manufacturing the same, and the display device provided in the embodiments of the present application. Specific examples are used in this article to illustrate the principles and implementation of the application, and the descriptions of the above examples are only used to help understand the methods and core ideas of the application; In addition, for those skilled in the art, according to the idea of the application, there will be changes in the specific implementation and the scope of application. In summary, the content of this specification should not be construed as a limitation of the application.

What is claimed is:

1. A display panel, comprising:
   a display panel body and a backplane arranged on a backlight side of the display panel body, wherein the display panel body comprises a display area, a bending area, and a bonding area, and the bending area is located between the display area and the bonding area; and
   a heat-sensitive adhesive layer disposed between the backplane and the display panel body; wherein a state of the heat-sensitive adhesive layer varies with temperature, the heat-sensitive adhesive layer is configured to, in a first state, have a first viscosity to the display panel body, and in a second state, have a second viscosity to the display panel body; and the second viscosity is greater than the first viscosity;
   wherein the heat-sensitive adhesive layer comprises an adhesive layer and temperature-responsive polymers, wherein in the first state, the temperature-responsive polymers are aggregated on a surface of the adhesive layer close to the display panel body, and in the second state, the temperature-responsive polymers are dispersed in the adhesive layer;
   wherein the display panel body comprises a base substrate, and the backplane is attached to the base substrate through the heat-sensitive adhesive layer, wherein each of the temperature-responsive polymers and the base substrate is hydrophilic; and
   wherein a material of the temperature-responsive polymers is (PEO-b-PNIPAM)-g-PBAMO, and the base substrate is made of polyimide.

2. The display panel of claim 1, wherein a length of the bending area is less than or equal to 0.7 millimeters (mm).

3. The display panel of claim 2, wherein the backplane comprises a notch located in the bending area, and the notch is formed by a laser process.

4. The display panel of claim 3, wherein the laser process is a femtosecond laser process.

5. A method of manufacturing a display panel, comprising:
   providing a display panel body, wherein the display panel body comprises a display area, a bending area, and a bonding area, and the bending area is located between the display area and the bonding area;
   providing a backplane, forming a heat-sensitive adhesive layer on a side of the backplane at a first temperature, and attaching the backplane to a backlight side of the display panel body through the heat-sensitive adhesive layer, wherein the backplane is arranged in the display area, the bending area, and the bonding area, wherein a state of the heat-sensitive adhesive layer varies with temperature, in a first state, the heat-sensitive adhesive layer has a first viscosity to the display panel body;

forming, by performing a laser process on the backplane in the bending area to remove the backplane in the bending area, a first backplane in the display area, a second backplane in the bonding area, and a notch in the bending area; and performing defoaming treatment on the first backplane in the display area and the second backplane in the bonding area, and maintaining a second temperature for a preset time, so that the heat-sensitive adhesive layer changes from the first state to a second state, wherein in the second state, the heat-sensitive adhesive layer has a second viscosity to the display panel body, and the second viscosity is greater than the first viscosity;

wherein the heat-sensitive adhesive layer comprises an adhesive layer and temperature-responsive polymers, wherein in the first state, the temperature-responsive polymers are aggregated on a surface of the adhesive layer close to the display panel body, and in the second state, the temperature-responsive polymers are dispersed in the adhesive layer;

wherein the display panel body comprises a base substrate, and the backplane is attached to the base substrate through the heat-sensitive adhesive layer, wherein each of the temperature-responsive polymers and the base substrate is hydrophilic; and wherein a material of the temperature-responsive polymers is (PEO-b-PNIPAM)-g-PBAMO, and the base substrate is made of polyimide.

6. The method of manufacturing the display panel of claim 5, wherein the first temperature ranges from 20° C. to 30° C., the first viscosity is 50-100 gram-force/inch (gf/inch), and the laser process is a femtosecond laser process, wherein the second temperature is greater than or equal to 50° C., the second viscosity is greater than or equal to 500 gf/inch, and the preset time is greater than or equal to 15 minutes.

7. The method of manufacturing the display panel of claim 5, wherein a length of the bending area is less than or equal to 0.7 millimeters (mm).

8. The method of manufacturing the display panel of claim 7, wherein the backplane comprises a notch located in the bending area, and the notch is formed by a laser process.

9. The method of manufacturing the display panel of claim 8, wherein the laser process is a femtosecond laser process.

10. A display device, comprising:

a casing and a display panel, the casing defining an accommodating space, and the display panel being disposed in the accommodating space, wherein the display panel comprises a display panel body and a backplane arranged on a backlight side of the display panel body, wherein the display panel body comprises a display area, a bending area, and a bonding area, and the bending area is located between the display area and the bonding area;

wherein the display panel further comprises a heat-sensitive adhesive layer disposed between the backplane and the display panel body; wherein a state of the heat-sensitive adhesive layer varies with temperature, the heat-sensitive adhesive layer is configured to, in a first state, have a first viscosity to the display panel body, and in a second state, have a second viscosity to the display panel body; and the second viscosity is greater than the first viscosity;

wherein the heat-sensitive adhesive layer comprises an adhesive layer and temperature-responsive polymers, wherein in the first state, the temperature-responsive polymers are aggregated on a surface of the adhesive layer close to the display panel body, and in the second state, the temperature-responsive polymers are dispersed in the adhesive layer;

wherein the display panel body comprises a base substrate, and the backplane is attached to the base substrate through the heat-sensitive adhesive layer, wherein each of the temperature-responsive polymers and the base substrate is hydrophilic; and wherein a material of the temperature-responsive polymers is (PEO-b-PNIPAM)-g-PBAMO, and the base substrate is made of polyimide.

11. The display device of claim 10, wherein a length of the bending area is less than or equal to 0.7 millimeters (mm).

12. The display device of claim 11, wherein the backplane comprises a notch located in the bending area, and the notch is formed by a laser process.

13. The display device of claim 12, wherein the laser process is a femtosecond laser process.

* * * * *